United States Patent
Yang et al.

(10) Patent No.: US 8,053,370 B2
(45) Date of Patent: Nov. 8, 2011

(54) SEMICONDUCTOR DEVICE AND FABRICATIONS THEREOF

(75) Inventors: Wei-Tung Yang, Taoyuan County (TW);
An-Hsiung Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 975 days.

(21) Appl. No.: 11/971,001

(22) Filed: Jan. 8, 2008

(65) Prior Publication Data

US 2008/0242100 A1 Oct. 2, 2008

(30) Foreign Application Priority Data

Mar. 29, 2007 (TW) .............................. 96110977 A (51) Int. Cl.
*H01L 21/302* (2006.01)
(52) U.S. Cl. ......... 438/736; 438/710; 438/737; 430/312
(58) Field of Classification Search .................. 438/424, 438/427, 706, 710, 736, 737, 738; 430/310, 430/312
See application file for complete search history.

(56) References Cited

U.S. PATENT DOCUMENTS

| | | | |
|---|---|---|---|
| 6,287,951 B1 * | 9/2001 | Lucas et al. | 438/618 |
| 6,805,614 B2 * | 10/2004 | Kwok | 451/37 |
| 2004/0067634 A1 * | 4/2004 | Kim et al. | 438/622 |
| 2005/0158966 A1 * | 7/2005 | Fang et al. | 438/427 |

* cited by examiner

Primary Examiner — Lan Vinh (57) ABSTRACT

A method for forming a semiconductor device is disclosed. A substrate comprising a structural layer thereon is provided. A hard mask layer is formed on the structural layer. A photoresist layer is formed on the hard mask layer. The photoresist layer is patterned to from a plurality of main photoresist patterns and at least one dummy photoresist pattern between the main photoresist patterns or adjacent to one of the main photoresist patterns, wherein width of the dummy photoresist pattern is less than that of the main photoresist patterns. Two main photoresist patterns are separated with each other by a first opening, and two dummy photoresist patterns are separated with each other by a second opening. Width of the second opening is less than that of the first opening. The hard mask layer is patterned using the patterned photoresist layer as a mask. The structural layer is patterned using the patterned hard mask layer as a mask.

11 Claims, 8 Drawing Sheets

SEMICONDUCTOR DEVICE AND FABRICATIONS THEREOF

BACKGROUND OF THE INVENTION

1. Field of the Invention

This invention relates to a method for forming a semiconductor device, and more particularly to a method for forming a memory device.

2. Description of the Related Art

With the wide application of integrated circuits (ICs), several kinds of semiconductor devices with high efficiency and low cost are produced based on different objectives. The dynamic random access memory (DRAM) is such an important semiconductor device in the information and electronics industry. Basically, a DRAM is an integrated circuit that stores data in binary form (e.g., "1" or "0") in a large number of cells.

Most DRAMs have one transistor and one capacitor in one DRAM cell. The memory capacity of the DRAM has reached 512 megabits (or further more than 1024 megabits). Therefore, under increasing integration it is required to shrink the size of the memory cell and the transistor so as to manufacture the DRAM with high memory capacity and high processing speed. A 3-D capacitor structure can itself reduce occupied area in the semiconductor substrate, so the 3-D capacitor, such as a deep trench capacitor, is applied to the fabrication of the DRAM of 1024 megabits and above.

Figure 1A:
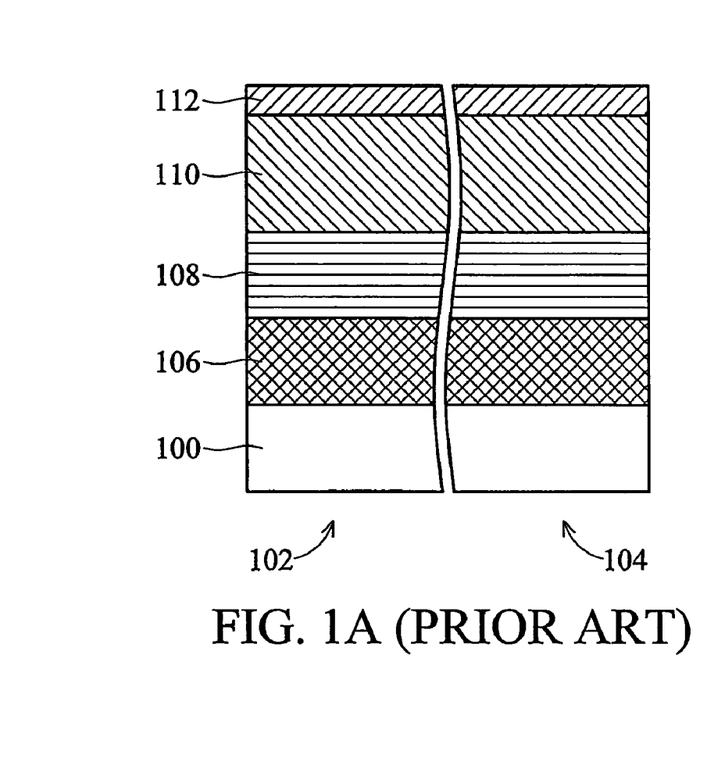
FIGS. 1A-1D show a conventional method for forming gate lines or metal lines of a semiconductor device.

FIGS. 1A-1D show a conventional method for forming gate lines or metal lines of a semiconductor device. Referring to FIG. 1A, a substrate 100 comprising an array region 102 and a periphery region 104 is provided, and a gate layer 106 is formed on top of both the array region 102 and the periphery region 104. Next, a silicon nitride layer 108 is formed on the gate layer 106. A polysilicon hard mask layer 110 is formed on the silicon nitride layer 108. A photoresist layer 112 is formed on the polysilicon hard mask layer 110.

Figure 1B:
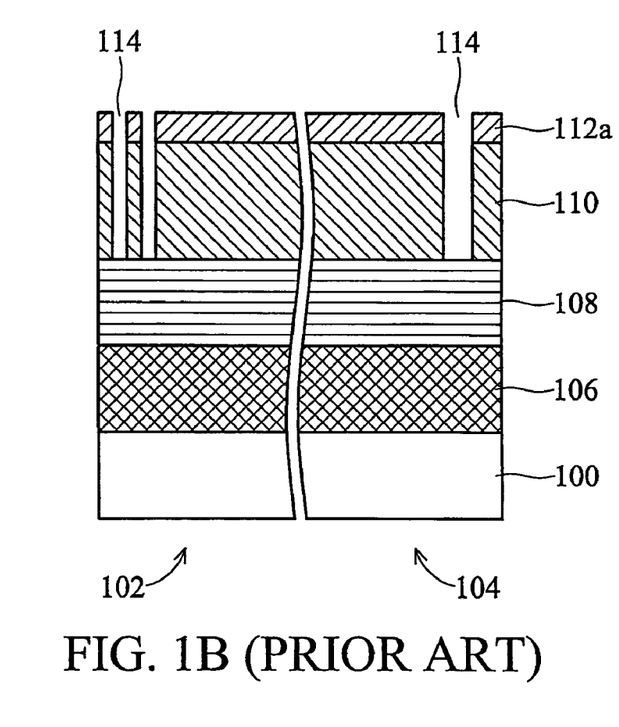
Figure 1C:
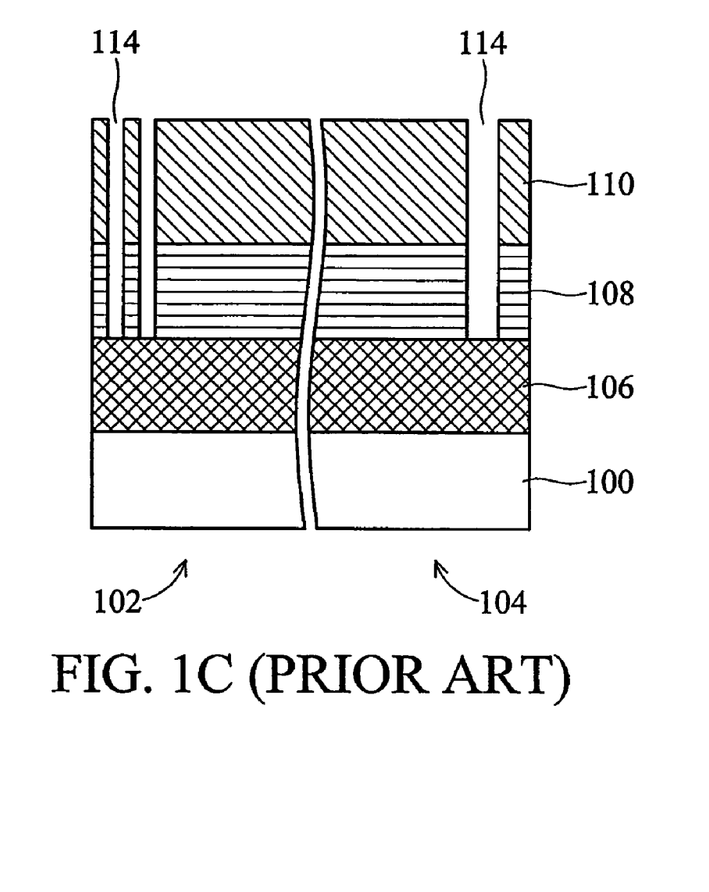
Figure 1D:
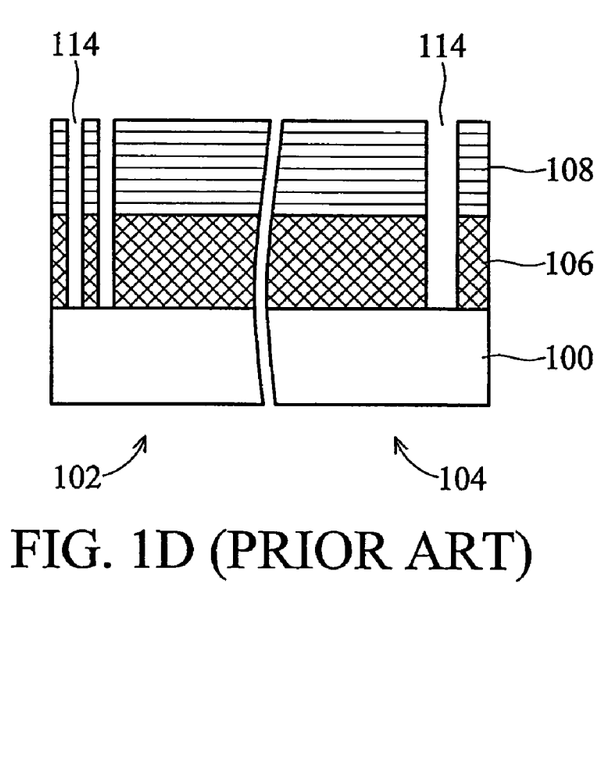

Referring to FIG. 1B, the photoresist layer 112 is defined by lithography process to form a plurality of photoresist patterns 112a, wherein parts of the photoresist patterns 112a in the array region 102 are more concentrated than those in the periphery region 104. Next, the polysilicon hard mask layer 110 is etched using the photoresist patterns 112a as a mask, forming a plurality of openings 114. Thereafter, referring to FIG. 1C, the photoresist patterns 112a are removed, and the silicon nitride layer 108 is etched using the etched polysilicon hard mask layer 110 as a mask to pattern the silicon nitride layer 108 according to the pattern of the etched polysilicon hard mask layer 110. Referring to FIG. 1D, the polysilicon hard mask layer 110 is removed. The gate layer 106 is then etched using the etched silicon nitride layer 108 as a mask to pattern the gate layer 106 according to the pattern of the etched silicon nitride layer 108.

In the above conventional method, when etching the polysilicon hard mask layer 110 or other layers using the photoresist patterns 112a as a mask, non-conventional line widths and/or etching depths occur. The issues are due to non-conventional plasma concentration from parts of the photoresist patterns 112a in the array region 102 being more concentrated than those in the periphery region 104. The issue is called loading effect, in which depths of the openings in the periphery region 104 is deeper than those in the array region 102. Further, when device density is higher, loading effect is more serious.

BRIEF SUMMARY OF INVENTION

A detailed description is given in the following embodiments with reference to the accompanying drawings. These and other problems are generally solved or circumvented, and technical advantages are generally achieved, by the invention.

The invention provides a method for forming a semiconductor device. A substrate comprising a structural layer thereon is provided. A hard mask layer is formed on the structural layer. A photoresist layer is formed on the hard mask layer. The photoresist layer is patterned to from a plurality of main photoresist patterns and at least one dummy photoresist pattern between the main photoresist patterns or adjacent to one of the main photoresist patterns, wherein width of the dummy photoresist pattern is less than that of the main photoresist patterns. Two main photoresist patterns are separated with each other by a first opening, and two dummy photoresist patterns are separated with each other by a second opening. One of the main photoresist patterns and the dummy photoresist pattern are separated by the second opening. Width of the second opening is less than that of the first opening. The hard mask layer is patterned using the patterned photoresist layer as a mask. The structural layer is patterned using the patterned hard mask layer as a mask.

The invention provides a method for forming a semiconductor device. A substrate comprising an array region and a periphery region is provided. A structural layer is formed on the substrate. A first hard mask layer is formed on the structural layer. A second hard mask layer is formed on the first hard mask. A photoresist layer is formed on the second hard mask layer. The photoresist layer is defined to form a patterned photoresist, comprising a plurality of main photoresist patterns and at least one dummy photoresist pattern between the main photoresist patterns or adjacent to one of the main photoresist patterns, wherein width of the dummy photoresist pattern is less than that of the main photoresist patterns. Two main photoresist patterns are separated with each other by a first opening, and two dummy photoresist patterns are separated with each other by a second opening. One of the main photoresist patterns and the dummy photoresist pattern are separated by the second opening. Width of the second opening is less than that of the first opening. Amount of the dummy metal pattern in the periphery region is more than that in the array region. The second hard mask layer is etched using the patterned photoresist layer as a mask. The patterned photoresist layer is removed. The first hard mask layer is etched using the etched second hard mask layer as a mask. The structural layer is etched using the patterned first hard mask layer as a mask.

BRIEF DESCRIPTION OF DRAWINGS

The invention can be more fully understood by reading the subsequent detailed description and examples with references made to the accompanying drawings, wherein:

FIGS. 2A-7B illustrate a method for forming gate lines or metal lines of an embodiment of the invention.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention are described with reference to the drawings that accompany the invention. It is noted that in the accompanying drawings, like and/or corresponding elements are referred to by like reference numerals.

Figure 2A:
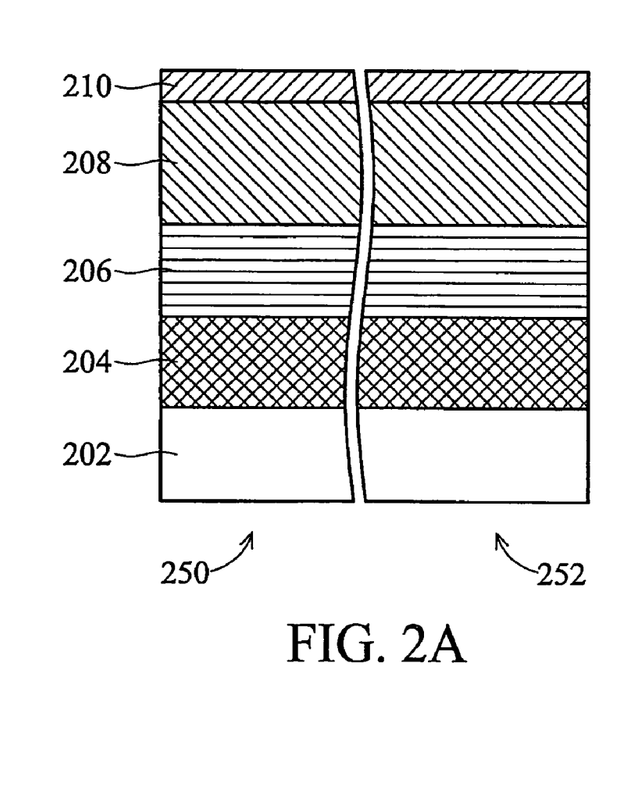

FIGS. 2A-7B illustrate a method for forming gate lines or metal lines constructed in accordance with an embodiment of the invention. Referring to FIGS. 2A and 2B (FIG. 2B is a top view of FIG. 2A), a substrate 202 comprising an array region 250 and a periphery region 252 is provided, in which the substrate 202 can be Si, Ge, SiGe, GaAs or silicon on insulators. Next, a structural layer 204 is formed thereon. The structural layer 204 preferably is a gate layer, but the invention is not limited thereto. The structural layer 204 can be a metal-line layer formed of Al or Cu, a dielectric layer such as silicon nitride or silicon oxide, or a layer formed of other materials. Alternatively, the structural layer 204 can be a composite layer or a stack layer.

Figure 2B:
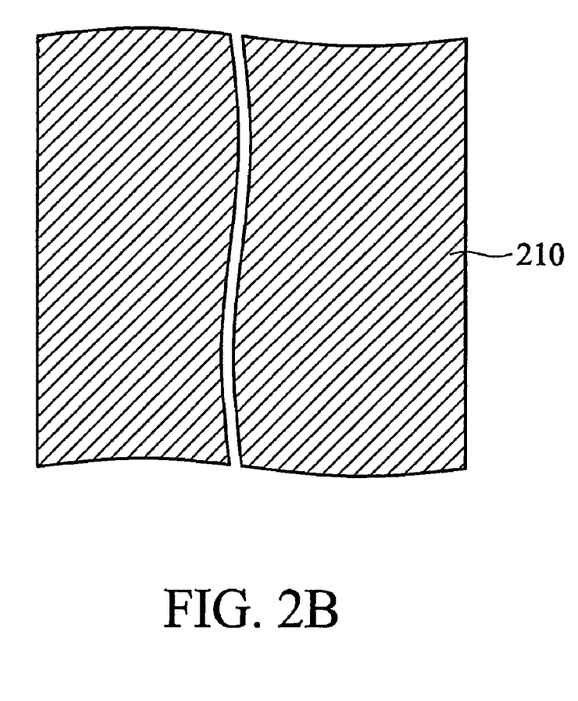

A first hard mask layer 206 is deposited on the structural layer 204 by chemical vapor deposition, CVD, or physical vapor deposition, PVD. The first hard mask layer 206 preferably comprises silicon nitride in this embodiment, but the invention is not limited thereto. The first hard mask layer 206 can also be oxide, such as BPSG, or carbide. Next, a second hard mask layer 208 is deposited on the first hard mask layer 206 by chemical vapor deposition, CVD, or physical vapor deposition, PVD. The second hard mask layer 208 can comprise polysilicon, silicon oxide, silicon nitride, carbide or silicon oxynitride, which preferably comprise polysilicon.

Formation of a stack of the first hard mask layer 206 and the second hard mask layer 208 is to achieve a good etching selectivity. The groups of composition of the first hard mask layer 206 and the second hard mask layer 208 are listed below. The first hard mask layer 206 is silicon nitride and the second hard mask layer 208 is polysilicon. The first hard mask layer 206 is silicon nitride and the second hard mask layer 208 is silicon oxide. The first hard mask layer 206 is BPSG and the second hard mask layer 208 is carbide. The first hard mask layer 206 is nitride and the second hard mask layer 208 is carbide.

Thereafter, a photoresist layer 210 is formed on the second hard mask layer 208 by spin coating.

Figure 3A:
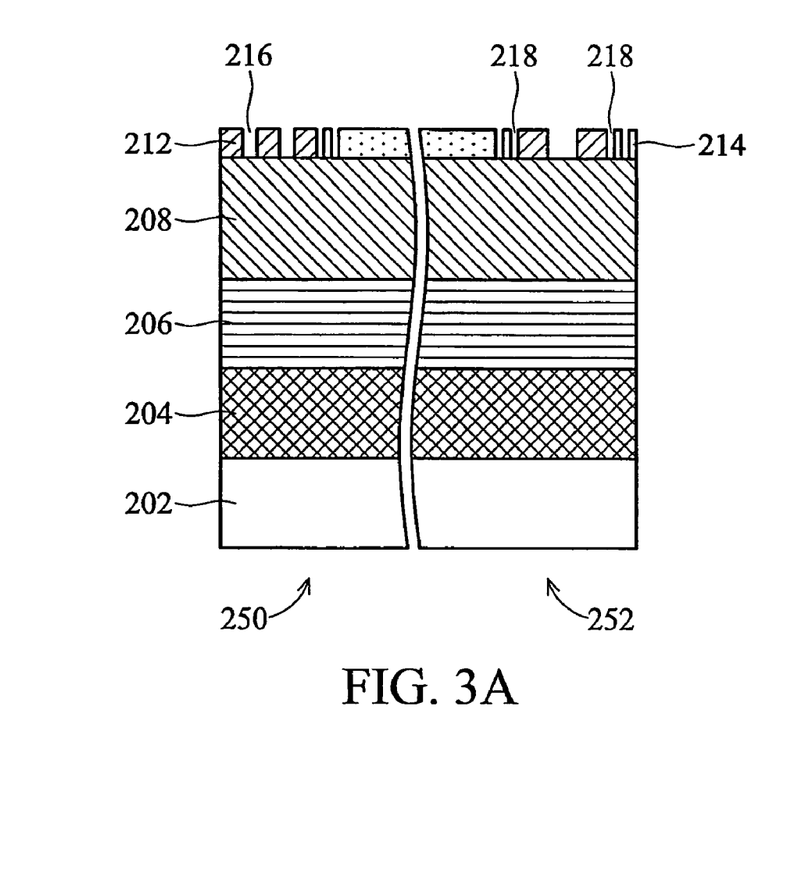
Figure 3B:
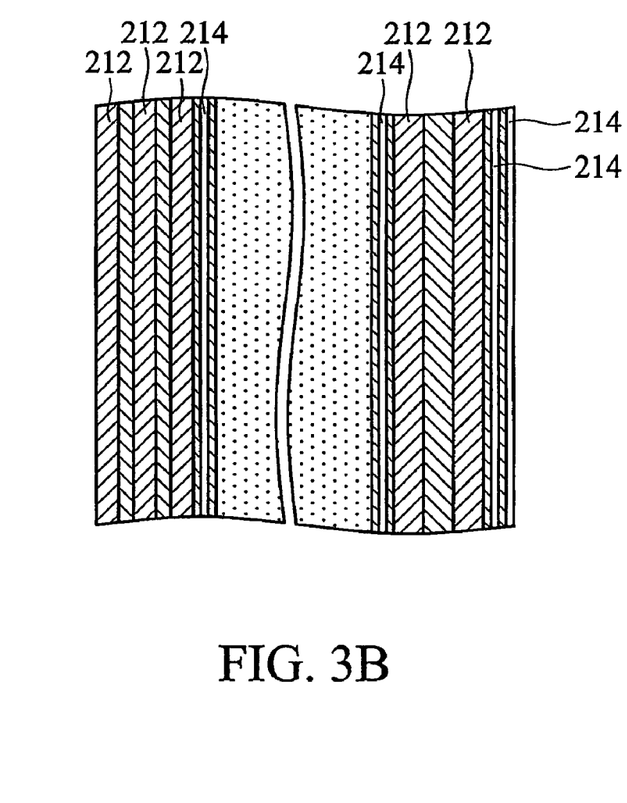

Referring to FIG. 3A and FIG. 3B (FIG. 3B is a top view of FIG. 3A), the photoresist layer is defined by photo lithography to form a photoresist pattern, comprising a plurality of main photoresist patterns 212 and dummy photoresist patterns 214. In a preferred embodiment of the invention, one or multiple dummy photoresist patterns 214 are interposed in the main photoresist patterns 212. Additionally, the main photoresist patterns 212 are preferably strip shaped, which can define the structural layer 204 into strip shaped structures, such as gate lines or conductive lines. Further, the dummy photoresist patterns 214 is also strip shaped, however, the invention is not limited thereto.

The preferable size and position of the main photoresist patterns 212 and dummy photoresist patterns 214 are listed below. Width of the dummy photoresist patterns 214 is smaller than that of the main photoresist patterns 212. The main photoresist patterns 212 are separated from each other by trench-shaped first openings 216. The dummy photoresist patterns 214 are separated from each other by a trench-shaped second opening 218, and the very dummy photoresist pattern 214 is separated from the closest main photoresist pattern 212 by one second opening 218. Width of the second openings 218 is preferably smaller than that of the first openings 216. In a preferred embodiment of the invention, width of the dummy photoresist patterns 214 is substantially 50%-70% of that of the main photoresist patterns 212, and width of the second openings 218 is substantially 50%-70% of that of the first openings 216. In addition, because the main photoresist patterns 212 are arranged loose in the periphery region 252 relative to the array region 250, more dummy photoresist patterns 214 can be arranged in the periphery region 252 than in the array region 250 to reduce loading effect.

Figure 4A:
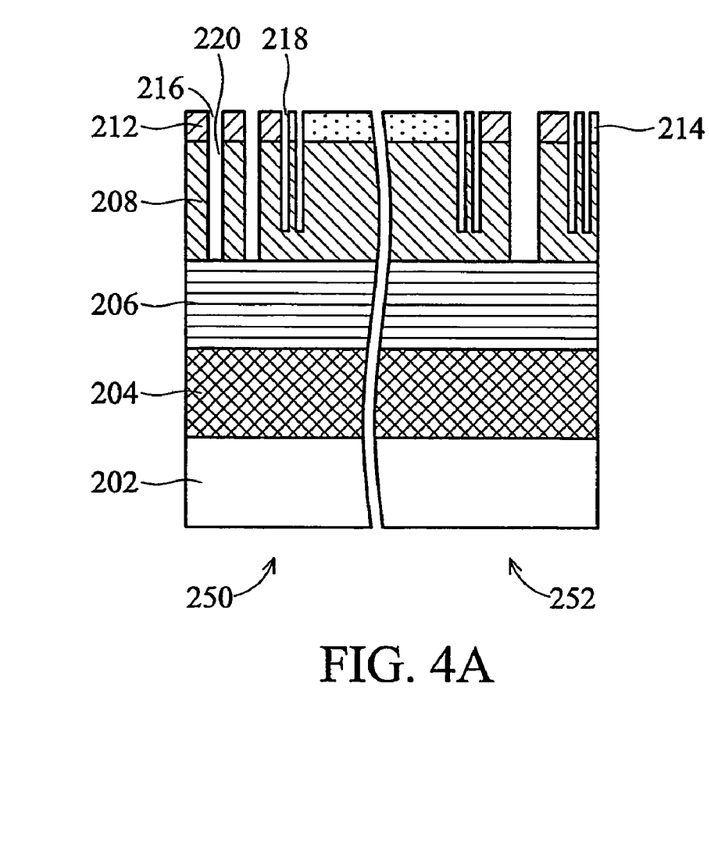
Figure 4B:
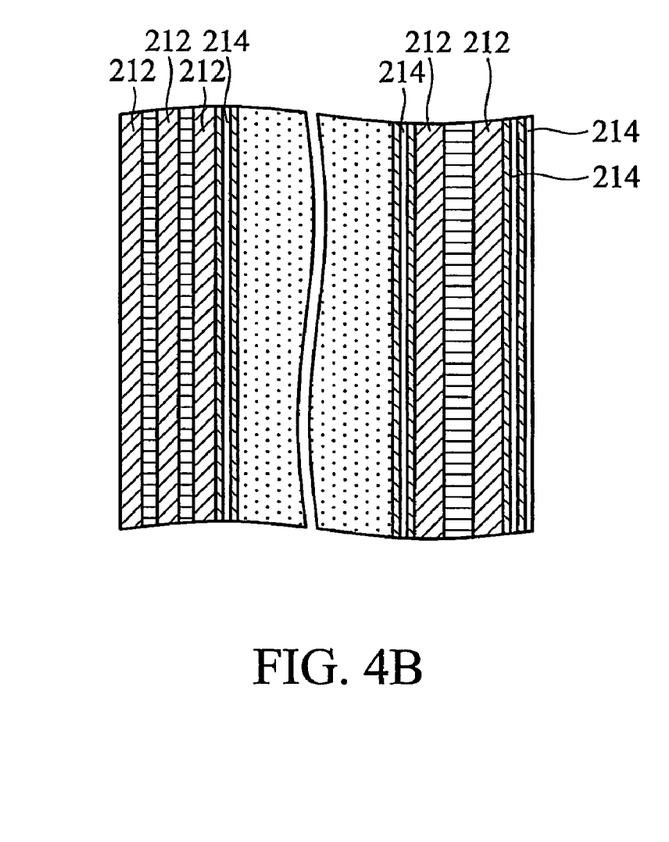

Referring to FIG. 4A and FIG. 4B, the second hard mask layer 208 is patterned via an anisotropic etching, such as plasma etching, using the main photoresist patterns 212 and dummy photoresist patterns 214 as a mask. In this embodiment, to achieve more uniform patterns during etching, arrangement of the dummy photoresist patterns 214 is adjusted to control etching plasma density. Because the width of the first openings 216 is wider than that of the second openings 218, the etching can etch through the second hard mask layer 208 via the first openings 216 to form second hard mask layer openings 220, but cannot etch through the second hard mask layer 208 via the second openings 218. That is, the second hard mask layer openings 220 formed according to the pattern of the first openings 216 only can partially expose the first hard mask layer 206. In contrast, only a partial portion of the second hard mask layer 208 in the second openings 218 is etched, without exposing the first hard mask layer 206.

Figure 5A:
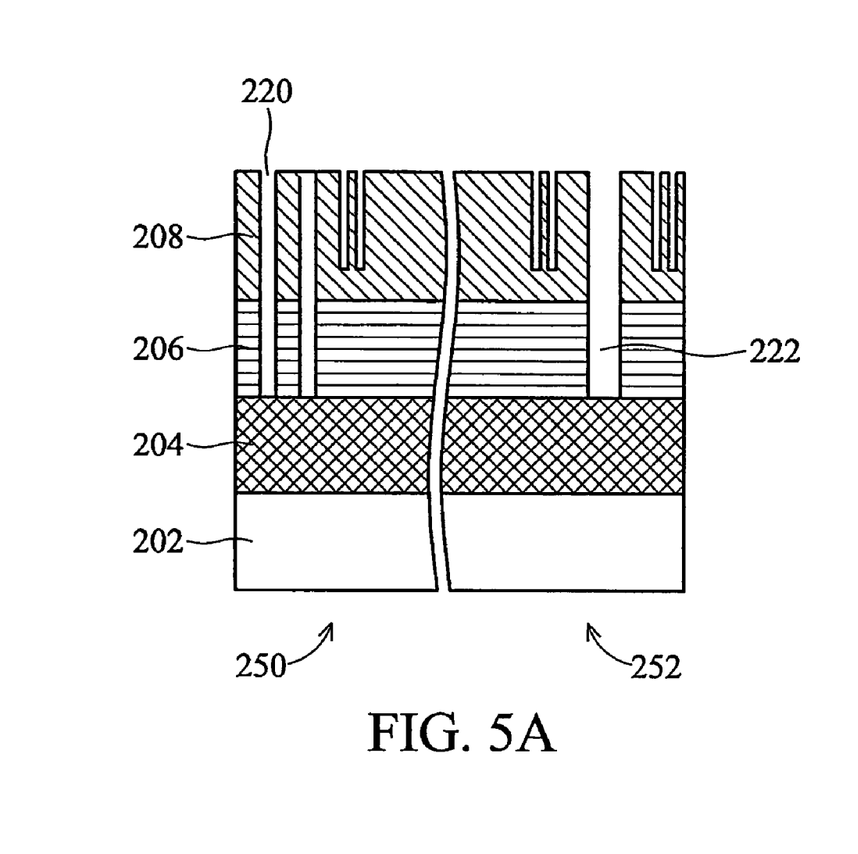
Figure 5B:
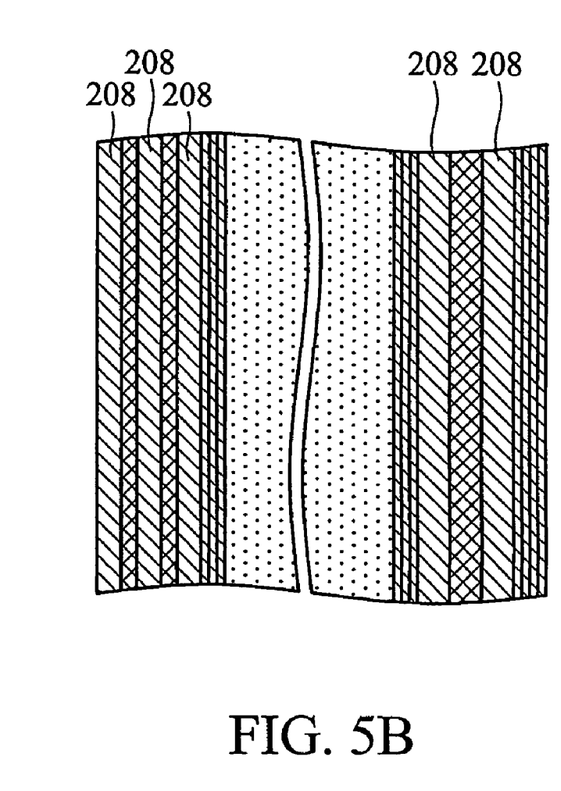

Referring to FIG. 5A and FIG. 5B, the first hard mask layer 206 is patterned using the second hard mask layer 208 as a mask via an anisotropic etching, such as plasma etching. In this embodiment, since the first openings 216 expose the first hard mask layer 206 and the second openings 218 does not expose the first hard mask layer 206, the etching process etches the first hard mask layer 206 via the first openings 216, but cannot etch the first hard mask layer 206 via the second openings 218. That is, only the second hard mask layer openings 220 corresponding to the first openings 216 expose the first hard mask layer 206. Therefore, the etching step described can only transfer patterns to the first hard mask layer 206 according to the first opening 216 to form first hard mask layer openings 222, not by the second openings 218 generated by the dummy photoresist patterns 214. In this embodiment, arrangement of the dummy photoresist patterns 214 does not affect pattern transfer from the original main photoresist patterns 212 to the underlying structural layer 204.

Figure 6A:
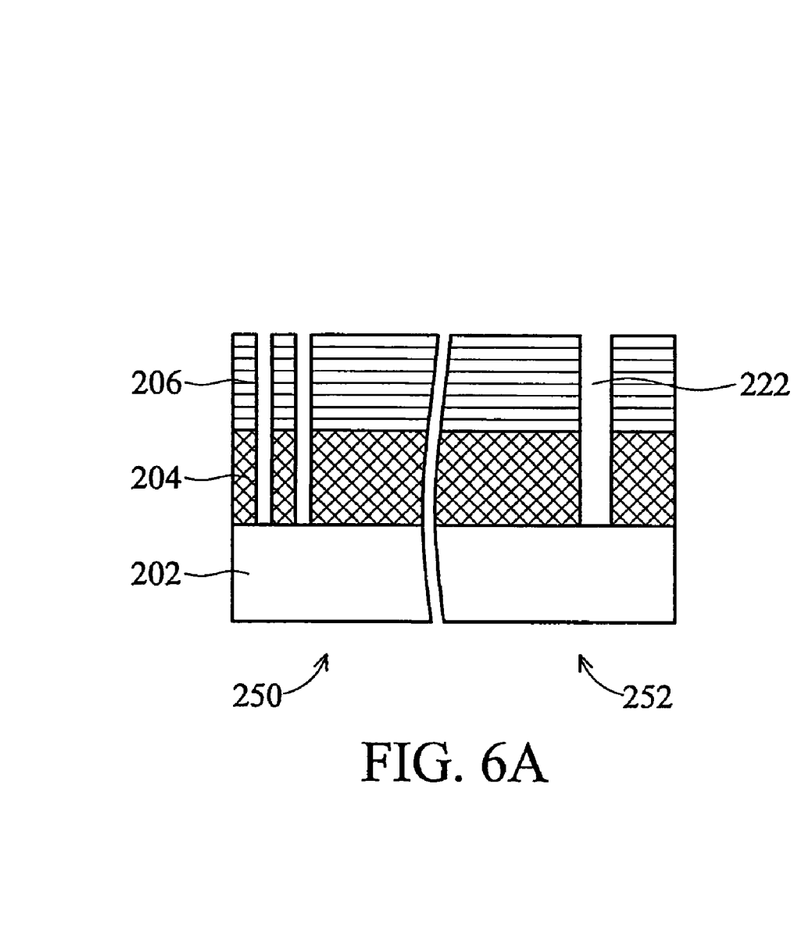
Figure 6B:
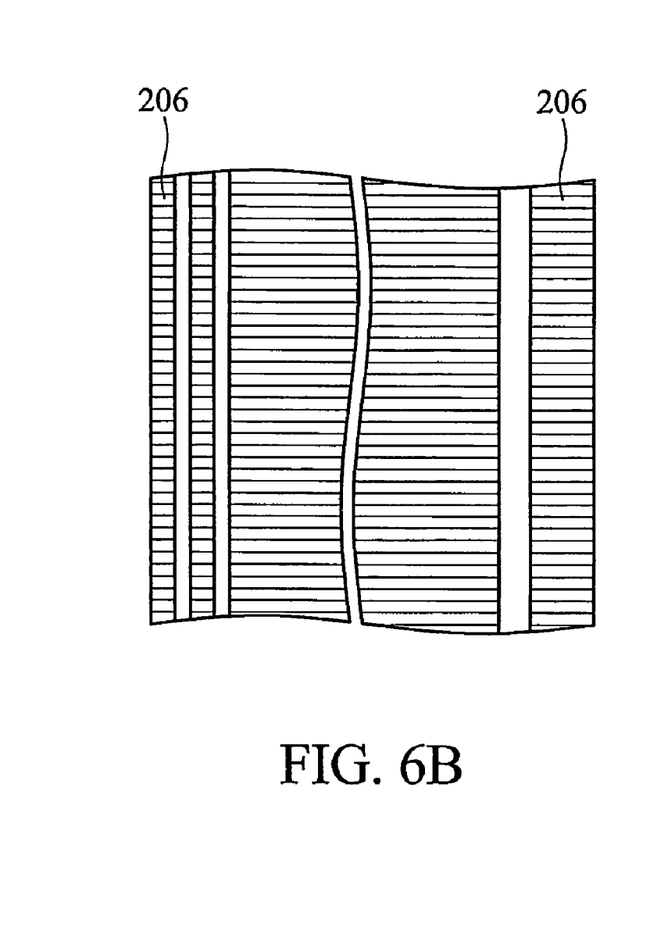
Figure 7A:
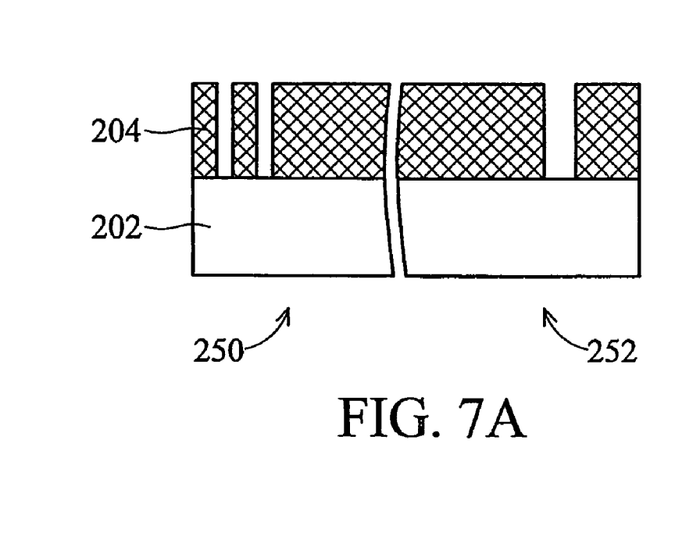
Figure 7B:
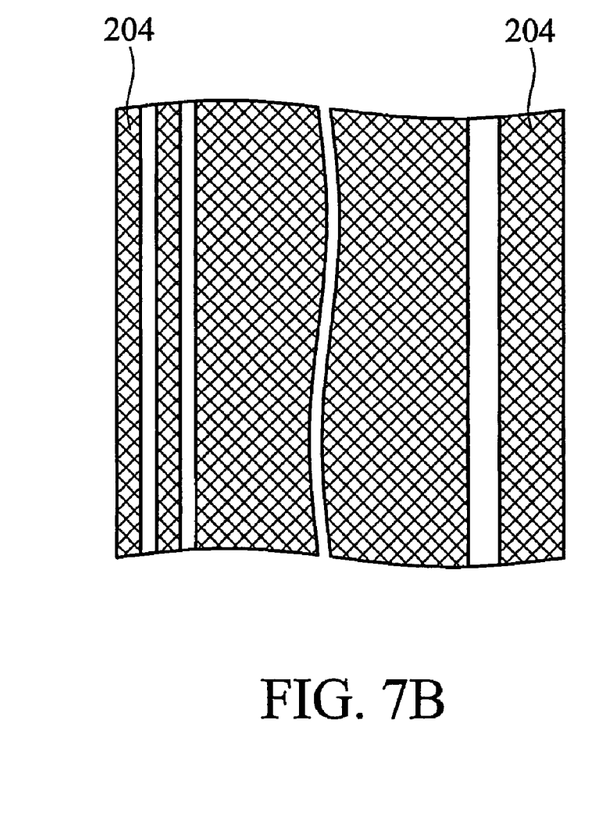

Referring to FIG. 6A and FIG. 6B, the second hard mask layer is removed. The structural layer 204 is patterned using the patterned first hard mask layer 206 as a mask through an anisotropic etching, such as plasma etching. Note that the patterned first hard mask layer 206 only contains patterns corresponding to the first openings 216, but patterns corresponding to the second openings 218. Accordingly, the structural layer 204 can be patterned only according the first openings 216 to form gate lines or other conductive lines. Next, referring to FIG. 7A and FIG. 7B, the first hard mask layer 206 is removed to finalize process of patterning the structural layer 204.

According an embodiment described, the dummy photoresist patterns 214 can achieve more uniform etching patterns and reduce loading effect by control plasma density. In addition, because the space between two dummy photoresist patterns 214 and the other space between one dummy photoresist pattern 214 and one main photoresist pattern 212 is small, the underlying structural layer 204 is not affected due to arrangement of dummy photoresist patterns 214 during transferring patterns. Further, arrangement of the dummy photoresist patterns 214 is easier for smaller sizes thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor device, comprising:
    providing a substrate having a structural layer thereon;
    forming a hard mask layer on the structural layer;
    forming a photoresist layer on the hard mask layer;
    patterning the photoresist layer to form multiple main photoresist patterns respectively separated from each other by a first width and multiple dummy photoresist patterns respectively separated from each other by a second width which is smaller than the first width, wherein a very dummy photoresist pattern is separated from the closest main photoresist pattern by one second width;
    patterning the hard mask layer using the patterned photoresist layer as a mask to partially expose the hard mask layer to allow the exposed hard mask layer to have a shape corresponding to the main photoresist layer; and
    patterning the structural layer using the patterned hard mask layer as a mask to partially expose the structural layer to allow the exposed structural layer to have a shape corresponding to the main photoresist layer;
    wherein the second width is 50%-70% of that of the first width;
    wherein the hard mask layer comprises a first hard mask layer formed on the structural layer and a second hard mask layer formed on the first hard mask layer;
    wherein the second hard mask layer is etched to form multiple first openings respectively separated from each other by the first width, whereas the second hard mask layer is free of second openings respectively separated from each other by the second width.

2. The method as claimed in claim 1, wherein the first hard mask layer is silicon nitride, and the second hard mask layer is polysilicon.

3. The method as claimed in claim 1, wherein the first hard mask layer is silicon nitride, and the second hard mask layer is silicon oxide.

4. The method as claimed in claim 1, wherein the first hard mask layer is silicon nitride, and the second hard mask layer is carbide.

5. The method as claimed in claim 1, wherein the main photoresist patterns and the dummy photoresist patterns are strip shaped.

6. The method for forming a semiconductor device as claimed in claim 5, wherein the second width is 50%-70% of that of the first width.

7. A method for forming a semiconductor device, comprising:
    providing a substrate having a structural layer thereon;
    forming a first hard mask layer on the structural layer;
    forming a second hard mask layer on the first hard mask layer;
    forming a photoresist layer on the second hard mask layer;
    patterning the photoresist layer to form multiple main photoresist patterns and first openings respectively separated from each other by a first width and dummy photoresist patterns and second openings respectively separated from each other by a second width which is smaller than the first width;
    patterning the second hard mask layer to allow the second hard mask layer to have a shape corresponding only to that of the first openings;
    removing the patterned photoresist layer;
    patterning the first hard mask layer to allow the first hard mask to have a shape corresponding only to that of the first openings; and
    patterning the structural layer so that the structural layer has a shape corresponding only to that of the first openings.

8. The method as claimed in claim 7, wherein the second width is of 50%-70% of that of the first width.

9. The method as claimed in claim 8, wherein the first hard mask layer is silicon nitride, and the second hard mask layer is polysilicon.

10. The method as claimed in claim 7, wherein the first hard mask layer is silicon nitride, and the second hard mask layer is silicon oxide.

11. The method for forming a semiconductor device as claimed in claim 10, wherein the first hard mask layer is silicon nitride, and the second hard mask layer is carbide.

* * * * *